US012730380B2

(12) United States Patent
Lee et al.

(10) Patent No.: US 12,730,380 B2
(45) Date of Patent: Sep. 8, 2026

(54) METHOD OF CONTROLLING SEMICONDUCTOR PROCESS AND SEMICONDUCTOR PROCESSING APPARATUS

(71) Applicant: SAMSUNG ELECTRONICS CO., LTD., Suwon-si (KR)

(72) Inventors: Jeongjin Lee, Suwon-si (KR); Doogyu Lee, Suwon-si (KR); Seungyoon Lee, Suwon-si (KR); Chan Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 598 days.

(21) Appl. No.: 18/218,246

(22) Filed: Jul. 5, 2023

(65) Prior Publication Data

US 2024/0152046 A1 May 9, 2024

(30) Foreign Application Priority Data

Nov. 8, 2022 (KR) ........................ 10-2022-0147629

(51) Int. Cl.
*G03F 7/20* (2006.01)
*G03F 7/00* (2006.01)
*G03F 1/70* (2012.01)

(52) U.S. Cl.
CPC ........ *G03F 7/2004* (2013.01); *G03F 7/70033* (2013.01); *G03F 7/70558* (2013.01); *G03F 1/70* (2013.01)

(58) Field of Classification Search
CPC ...... G03F 1/70; G03F 7/2004; G03F 7/70033; G03F 7/70558; G03F 7/70633; G03F 7/70683; G03F 7/706837; H10P 76/2041; H10P 74/203; H10P 74/23; H10W 46/00; H10W 46/301
See application file for complete search history.

(56) References Cited

U.S. PATENT DOCUMENTS 7,571,420 B2 8/2009 Wong et al.
2012/0028174 A1 2/2012 Lu et al.
2014/0272717 A1 9/2014 Cheng et al.
(Continued)

FOREIGN PATENT DOCUMENTS

KR 10-2011-0095831 A 8/2011

*Primary Examiner* — Stewart A Fraser
(74) *Attorney, Agent, or Firm* — Muir Patent Law, PLLC

(57) ABSTRACT

A method of controlling semiconductor process includes forming a plurality of sample overlay keys by irradiating a first dose of extreme ultraviolet (EUV) light to a first photoresist layer formed on at least one sample wafer; determining a sample correction parameter for correcting a sample overlay error measured from the plurality of sample overlay keys; updating the sample correction parameter based on a difference between the first dose and a second dose; forming a plurality of main overlay keys by irradiating a second dose of extreme ultraviolet light to a second photoresist layer formed on the sample wafer based on the updated sample correction parameter; determining the main correction parameter based on a main overlay error measured from the plurality of main overlay keys; and performing a photolithography process on a wafer different from the sample wafer based on the main correction parameter.

16 Claims, 14 Drawing Sheets

(56) References Cited

U.S. PATENT DOCUMENTS

2020/0166854 A1 5/2020 Yagubizade et al.
2020/0371441 A1 11/2020 Tel et al.
2021/0080837 A1 3/2021 Rijpstra et al.
2021/0216021 A1 7/2021 Demirer et al.
2021/0333701 A1* 10/2021 Lee .......................... G03F 1/24
2022/0187713 A1 6/2022 Middlebrooks et al.
2022/0187786 A1 6/2022 Hauptmann et al.

* cited by examiner 303
340
300

METHOD OF CONTROLLING SEMICONDUCTOR PROCESS AND SEMICONDUCTOR PROCESSING APPARATUS

CROSS-REFERENCE TO RELATED APPLICATION

This application claims benefit of priority to Korean Patent Application No. 10-2022-0147629, filed on Nov. 8, 2022, in the Korean Intellectual Property Office, the disclosure of which is incorporated herein by reference in its entirety.

BACKGROUND

1. Field

Example embodiments of the present disclosure relate to a method of controlling a semiconductor process and a semiconductor processing apparatus.

2. Description of the Related Art

A semiconductor process may include, e.g., a photolithography process, an etching process, a deposition process, and the like, for forming a plurality of layers on a substrate, and a plurality of patterns may be formed on each of the plurality of layers. As line widths of the plurality of patterns and a spacing between the patterns have been gradually refined, a photolithography process using a shorter wavelength, e.g., extreme ultraviolet (EUV) light, has been suggested.

SUMMARY

According to an example embodiment of the present disclosure, a method of controlling a semiconductor process includes forming a plurality of sample overlay keys by irradiating a first dose of extreme ultraviolet (EUV) light to a first photoresist layer formed on at least one sample wafer; determining a sample correction parameter for correcting a sample overlay error measured from the plurality of sample overlay keys; updating the sample correction parameter based on a difference between the first dose and a second dose; forming a plurality of main overlay keys by irradiating a second dose of extreme ultraviolet light to a second photoresist layer formed on the sample wafer based on the updated sample correction parameter; determining the main correction parameter based on a main overlay error measured from the plurality of main overlay keys; and performing a photolithography process on a wafer different from the sample wafer based on the main correction parameter.

According to an example embodiment of the present disclosure, a method of controlling a semiconductor process includes forming a plurality of sample layers including a plurality of sample overlay keys on at least one sample wafer while a light source outputs a first dose of extreme ultraviolet (EUV) light; generating a sample correction parameter based on a sample overlay error measured from the plurality of sample overlay keys; forming a plurality of layers including a plurality of main overlay keys on the sample wafer while the light source outputs a second dose of EUV light different from the first dose; generating a main correction parameter using the sample correction parameter, and a difference between a main overlay error measured in the plurality of main overlay keys and the sample overlay error; and controlling a photolithography process performed on a wafer different from the sample wafer using the main correction parameter.

According to an example embodiment of the present disclosure, a semiconductor processing apparatus includes a light source configured to output EUV light; a mask stage on which a mask is seated; a wafer stage on which a wafer is seated; an optical system configured to reflect EUV light output by the light source and to allow EUV light reflected from the mask to be incident to the wafer; and a control unit configured to control the light source, the mask stage, the wafer stage, and the optical system, wherein, when a first lot arrives in a state in which no previous history is present, the control unit performs sets output of the light source to be a first dose and a second dose higher than the first dose sequentially, performs a sample photolithography process on at least one sample wafer included in the first lot and determines a main correction parameter for correcting an overlay error, and wherein, when a second lot arrives following the first lot, the control unit determines output of the light source to be the second dose and performs a photolithography process on a plurality of wafers included in the second lot based on the main correction parameter.

BRIEF DESCRIPTION OF DRAWINGS

Features will become apparent to those of skill in the art by describing in detail exemplary embodiments with reference to the attached drawings, in which.

DETAILED DESCRIPTION

Hereinafter, embodiments of the present disclosure will be described as follows with reference to the accompanying drawings.

Figure 1:
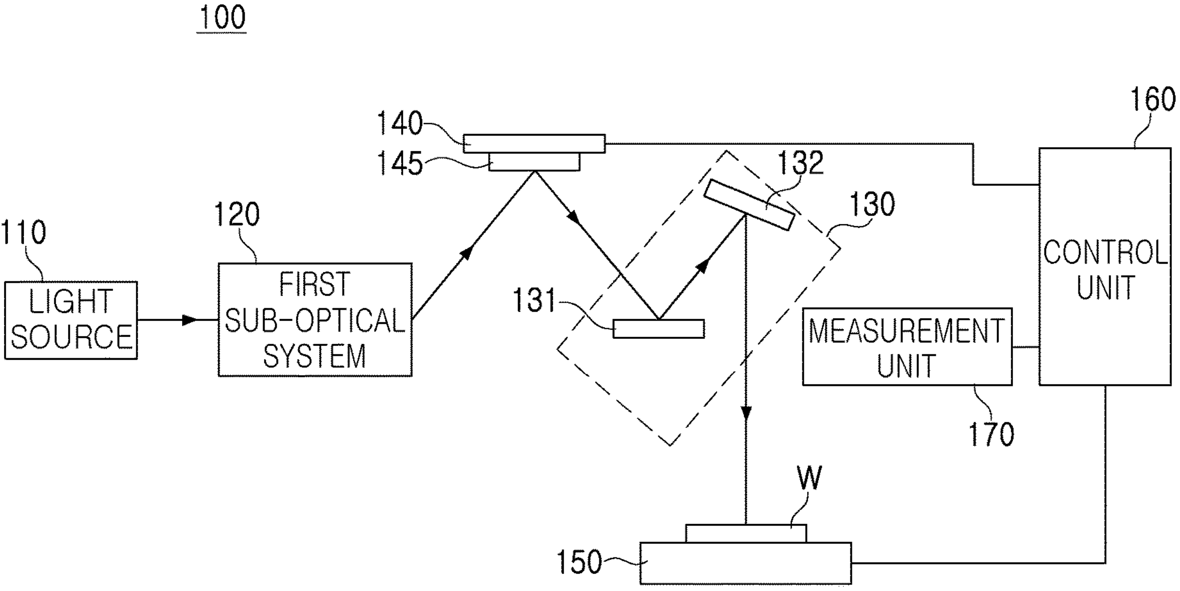
FIG. 1 is a diagram illustrating a semiconductor processing apparatus according to an example embodiment of the present disclosure.

FIG. 1 is a schematic diagram illustrating a semiconductor processing apparatus according to an example embodiment.

Referring to FIG. 1, a semiconductor processing apparatus 100 in an example embodiment may be configured to perform a photolithography process, and may include a light source 110, a first sub-optical system 120, a second sub-optical system 130, a mask stage 140, a wafer stage 150, a control unit 160, and a measurement unit 170.

The light source 110 may generate and emit EUV radiation (e.g., EUV light) having a high degree of energy density within a wavelength range of several nanometers to several tens of nanometers. In example embodiments, the light source 110 may generate and output EUV light having a high degree of energy density in a 13.5 nm wavelength band. The light source 110 may include, e.g., a plasma-based light source or a synchrotron radiation light source. A plasma-based light source may generate plasma and may use light emitted by the plasma, and may include, e.g., a laser-produced plasma (LPP) light source or a discharge-produced plasma (DPP) light source. For example, when the light source 110 includes a plasma-based light source, a condensing mirror, e.g., an elliptical mirror or a spherical mirror, for increasing energy density of EUV light incident on the first sub-optical system 120 may be further included in the light source 110.

The first sub-optical system 120 may include a plurality of mirrors. For example, in the semiconductor processing apparatus 100 according to an example embodiment, the first sub-optical system 120 may include two or three mirrors. The first sub-optical system 120 may transfer EUV light emitted from the light source 110 to the mask 145. EUV light emitted from the light source 110 may be reflected by mirrors included in the first sub-optical system 120 and may be incident on the mask 145 mounted on the mask stage 140. In an example embodiment, the first sub-optical system 120 may curve EUV light in the form of a curved slit and may allow light to be incident on the mask 145.

The mask 145 may be a reflective mask including a reflective region, a non-reflective region, and/or an intermediate reflective region. The mask 145 may include a reflective multilayer film for reflecting EUV light from a substrate formed of a low thermal expansion coefficient material (LTEM), e.g., quartz, and an absorption layer pattern formed on the reflective multilayer film. The reflective multilayer film may have a structure in which a molybdenum film (Mo layer) and a silicon film (Si layer) are alternately stacked. The absorption layer may be formed of, e.g., TaN, TaNO, TaBO, Ni, Au, Ag, C, Te, Pt, Pd, Cr, or the like. For example, the absorption layer portion may correspond to the above-described non-reflective region and/or intermediate reflective region.

The mask 145 may reflect EUV light from the first sub-optical system 120 toward the second sub-optical system 130. For example, EUV light passing through the first sub-optical system 120 may be structured according to a pattern shape including a reflective multilayer film and an absorption layer on a substrate, and may be incident on the second sub-optical system 130. EUV light may be structured to include at least second-order diffracted light based on the pattern on the mask 145. The structured EUV light may be incident on the second sub-optical system 130 while retaining the pattern shape information included in the mask 145, and may be irradiated toward the wafer W through the second sub-optical system 130 such that an image corresponding to the pattern shape included in the mask 145 is formed. For example, the structured EUV light may be irradiated toward the photoresist layer applied on the wafer W and may form a predetermined pattern on the photoresist layer.

The second sub-optical system 130 may include a plurality of mirrors. For example, as illustrated in FIG. 1, the second sub-optical system 130 may include a first mirror 131 and a second mirror 132. In another example, the second sub-optical system 130 may include three or more mirrors, e.g., four to eight mirrors.

The second sub-optical system 130 may be controlled such that the EUV light reflected from the mask 145 is incident while forming a predetermined slope with respect to the upper surface of the wafer W. For example, the second sub-optical system 130 may adjust a travel path of the EUV light such that the EUV light may be incident while forming an angle of about 6 degrees with the upper surface of the wafer W.

The mask 145 may be seated on the mask stage 140, and the wafer W may be seated on the wafer stage 150. For example, the mask stage 140 and the wafer stage 150 may be controlled by the control unit 160 (e.g., a controller). In the initial state, in which the mask 145 and the wafer W are seated on the mask stage 140 and the wafer stage 150, respectively, when the upper surface of the mask 145 and the wafer W is defined as an X-Y plane, each of the mask stage 140 and the wafer stage 150 may be moved by the control unit 160. In an example embodiment, the control unit 160 may rotate each of the mask stage 140 and the wafer stage 150 on the X-Y plane with respect to the Z-axis, or on the Y-Z plane or the X-Z plane with respect to one axis of the X-Y plane. By the movement of the mask stage 140 and/or the wafer stage 150, as described above, the mask 145 and/or the wafer W may move or rotate along at least one of the X-axis, Y-axis, and Z-axis.

The measurement unit 170 may measure a critical dimension (CD) and/or overlay error of a plurality of patterns formed on the wafer W. For example, the measurement unit 170 may include an electron microscope or an optical microscope, e.g., a scanning electron microscope (SEM) or a transmission electron microscope (TEM). Also, the measurement unit 170 may measure a critical dimension or an overlay error using an image ellipsoidal polarization method or a spectroscopic image ellipsoidal polarization method. In example embodiments, the measurement unit 170 may be provided as a device different from the semiconductor processing apparatus 100.

For example, when a first layer and a second layer are stacked in order on the wafer W, the measurement unit 170 may measure overlay errors of a plurality of first overlay keys included in the first layer and a plurality of second overlay keys included in the second layer. The control unit 160 may generate a correction parameter for adjusting at least one of the light source 110, the optical systems 120 and 130, the mask stage 140, and the wafer stage 150 based on the overlay error measured by the measurement unit 170. As the control unit 160 performs the photolithography process based on the correction parameter, an overlay error may be reduced.

However, when the photolithography process is started in the absence of a previous history, a correction parameter for reducing an overlay error by the control unit 160 by adjusting the light source 110, the optical systems 120 and 130, the mask stage 140, and the wafer stage 150 may not be present. Accordingly, the control unit 160 may form a photoresist layer on a sample wafer, may perform a sample photolithography process, may measure the overlay error, and may generate a main correction parameter required to control the photolithography process for forming an actual semiconductor device based on the measured error.

In an example embodiment, the sample photolithography process for generating a main correction parameter may be executed under conditions different from those of a general photolithography process. For example, a sample photolithography process is performed with a first dose (dose) of EUV light, whereas a photolithography process for actually forming a semiconductor device may be performed with a second dose of EUV light, higher than the first dose. Also, in an example embodiment, a photoresist layer having relatively low quality may be used in the sample photolithography process. Accordingly, time and costs required for the sample photolithography process may be reduced, and efficiency of the semiconductor process may be improved.

Figure 2:
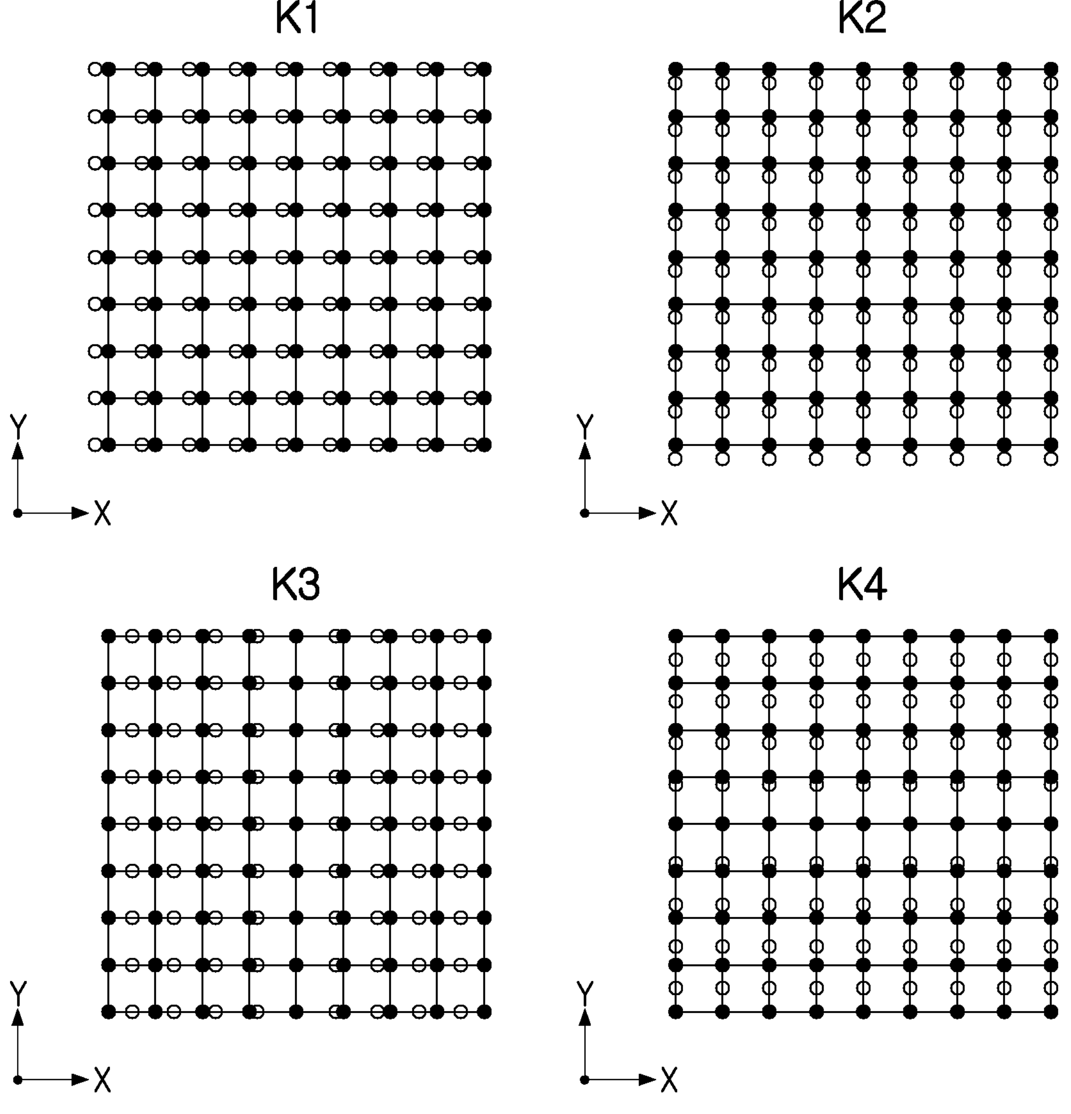
FIGS. 2 to 4 are diagrams illustrating a method of correcting an overlay according to an example embodiment of the present disclosure.
Figure 3:
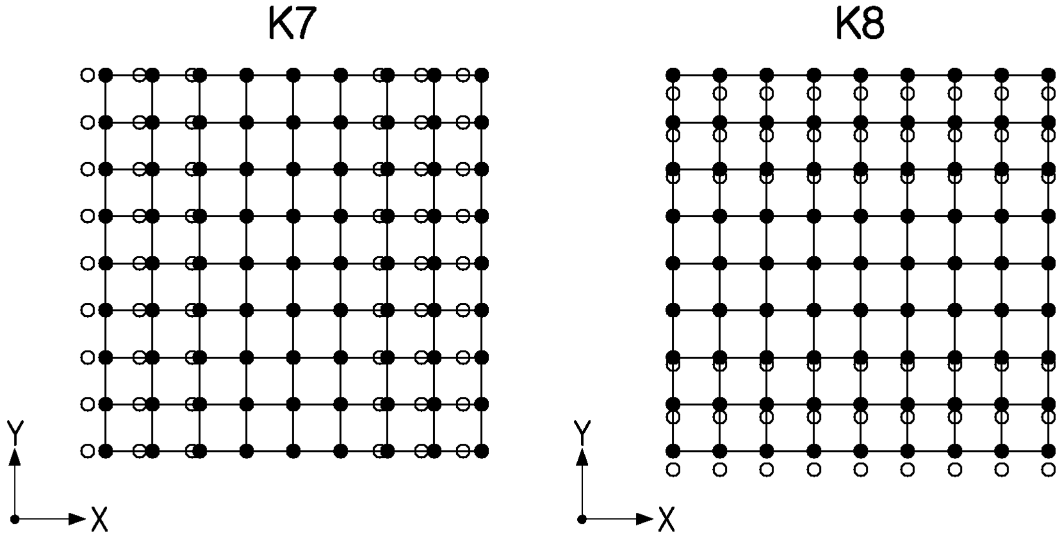
Figure 4:
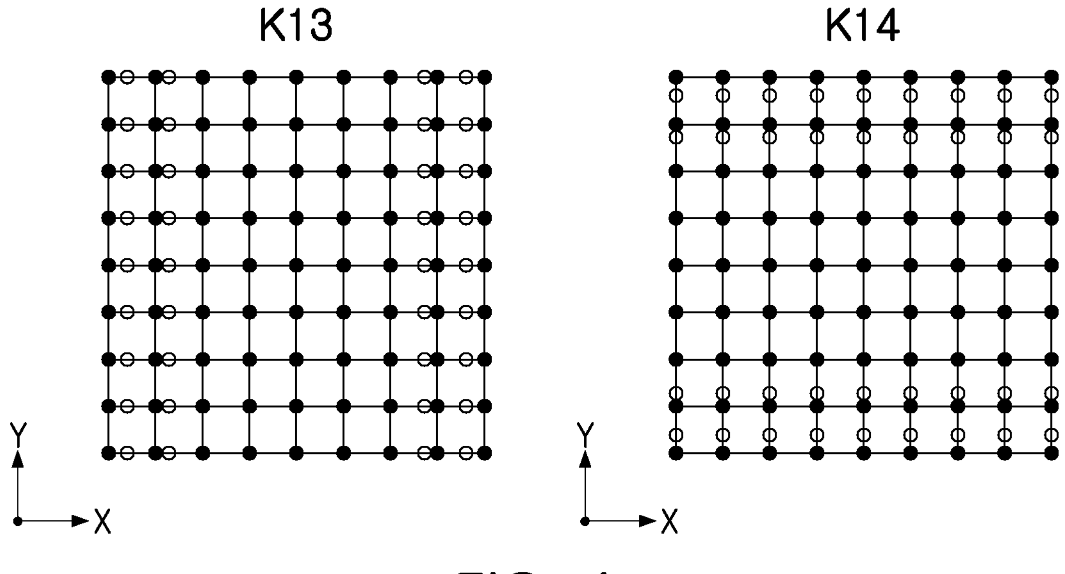

FIGS. 2 to 4 are diagrams illustrating a method of correcting an overlay according to an example embodiment.

FIG. 2 is a diagram illustrating linear correction parameters corresponding to the first order among correction parameters for correcting an overlay error. For example, the K1 correction parameter may be configured to correct the overlay error constantly occurring on one side in the X-axis direction, and the K2 correction parameter may be configured to correct the overlay error constantly occurring on one side in the Y-axis direction. Accordingly, the K1 correction parameter may be represented in the form of dx=k1, which is a deviation in the X-axis direction, and the K2 correction parameter may be represented in the form of dy=k2, a coordinate deviation in the Y-axis direction.

The K3 correction parameter may be for an overlay error proportional to coordinates on both sides in the X-axis direction, and the K4 correction parameter may be for an overlay error proportional to coordinates on both sides in the Y-axis direction. Accordingly, the K3 correction parameter may be represented in the form of dx=k3*x, and the K4 correction parameter may be represented in the form of dy=k4*y. Also, in example embodiments, other linear correction parameters may be further generated in addition to the K1 to K4 correction parameters.

FIG. 3 is a diagram illustrating correction parameters corresponding to the second order among correction parameters for correcting an overlay error. For example, the K7 correction parameter may be for an overlay error proportional to the square of the coordinates on both sides in the X-axis direction, and the K8 correction parameter may be for an overlay error of a size proportional to the square of the coordinates on both sides in the Y-axis direction. Accordingly, the K7 correction parameter may be represented in the form of $dx=k7*x^2$, and the K8 correction parameter may be represented in the form of $dy=k8*y^2$. However, other second order correction parameters may also be defined in addition to K7 correction parameters and K8 correction parameters.

FIG. 4 is a diagram illustrating correction parameters corresponding to the third order among correction parameters for correcting an overlay error. In an example embodiment illustrated in FIG. 4, the K13 correction parameter may be for an overlay error proportional to the cube of the coordinates on both sides in the X-axis direction. The K14 correction parameter may be for correcting an overlay error proportional to the cube of the coordinates on both sides of the Y-axis direction.

The K13 correction parameter may be defined as $dx=k3*x^3$, and the K14 correction parameter may be defined as $dy=k14*y^3$. Also, in example embodiments, other correction parameters may be further defined as the third order correction parameters other than the K13 correction parameter and the K14 correction parameter. For example, a K15 correction parameter proportional to the product of the square of the X-axis coordinate and the Y-axis coordinate in the X-axis direction may be represented as $dx=k15*x^2*y$.

Correction parameters for reducing an overlay error in an example embodiment may be determined in a sample process. The sample process may be a process for forming only overlay keys on a wafer (e.g., without other than semiconductor elements involved in an actual operation of the semiconductor device). The overlay keys may have a relatively larger critical dimension than structures included in the semiconductor elements, and accordingly, the sample process may be performed with relatively low accuracy as compared to the main process of forming the semiconductor elements.

In an example embodiment, a sample photolithography process of irradiating EUV light to a photoresist layer to form overlay keys in a sample process may be performed with relatively weak intensity EUV light. Also, when desired, a photoresist layer for forming overlay keys may be used as a product of relatively lower quality than the photoresist layer used for forming the semiconductor elements. Accordingly, the costs and time required for the sample process may be reduced, and overall efficiency of the semiconductor process may be improved.

However, as compared to the photolithography process for forming semiconductor elements, by differently controlling or adopting the EUV light and/or the photoresist layer in the sample photolithography process, the accuracy of the correction parameter for correcting the overlay error may be reduced. In other words, when the correction parameter is determined only with the overlay error measured in the sample photolithography process, the overlay error may not be sufficiently corrected.

In an example embodiment, a first photolithography process may be performed to generate a first correction parameter, and a second photolithography process may be performed under the same conditions as the photolithography process for forming semiconductor elements. For example, semiconductor elements may be formed by the second photolithography process and subsequent processes. Also, an overlay error may be re-measured from overlay keys formed by the second photolithography process, and a main correction parameter necessary for controlling the photolithography process forming semiconductor elements may be determined based on the overlay error. Accordingly, a main correction parameter to reduce an overlay error may be generated while reducing the costs and time required for the sample process.

Figure 5:
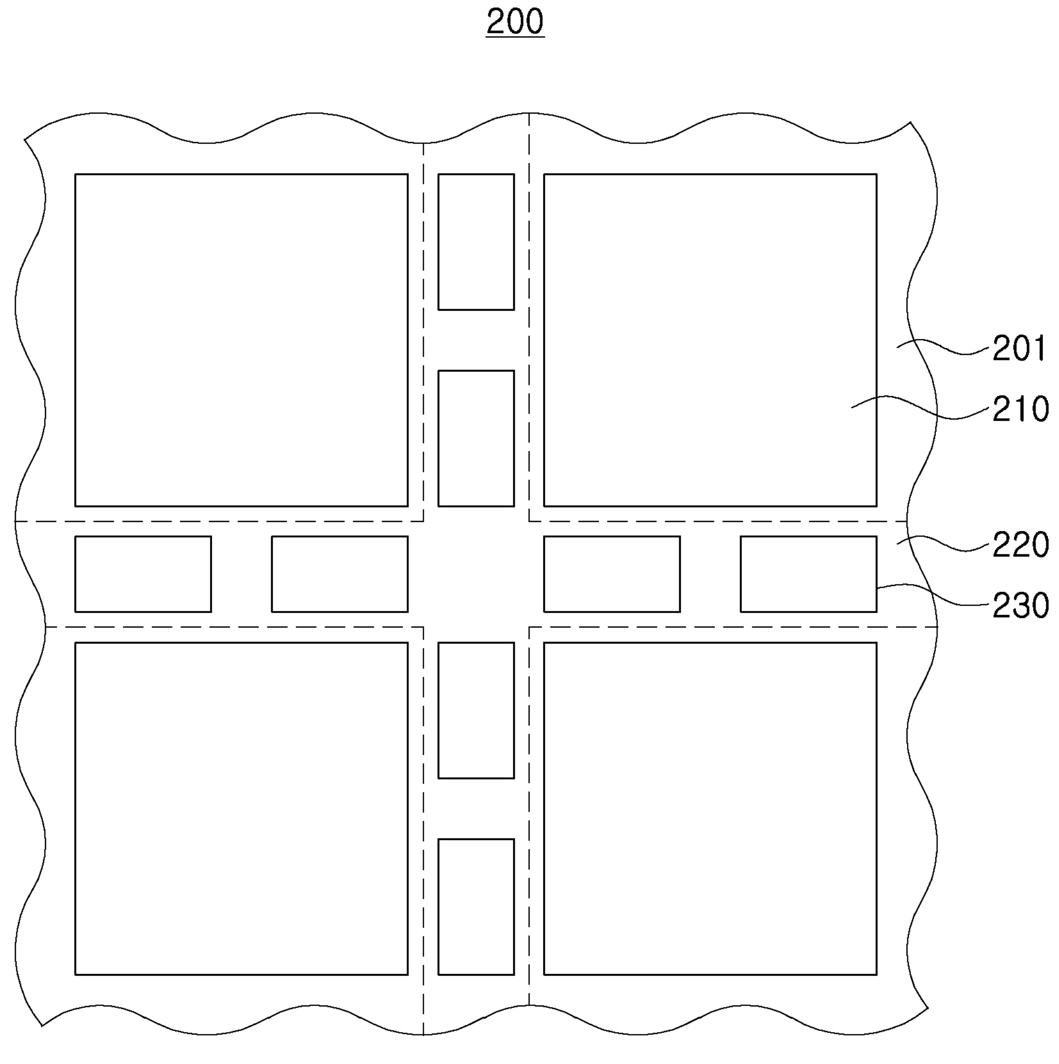
FIG. 5 is a diagram illustrating a semiconductor device according to an example embodiment of the present disclosure.

FIG. 5 is a diagram illustrating a semiconductor device according to an example embodiment.

Referring to FIG. 5, a semiconductor device 200 in an example embodiment may include a wafer 201, a plurality of chip regions 210 defined in the wafer 201, and an isolation region 220 defined between (adjacent ones of) the plurality of chip regions 210. The plurality of chip regions 210 may be isolated from each other by the isolation region 220. The isolation region 220 may include a cutting region cut-out by a sawing machine or a dicing machine.

In each of the plurality of chip regions 210, a plurality of elements included in an integrated circuit (e.g., transistors, capacitors, and resistors) may be formed. Overlay keys may be formed in the key regions 230 of the isolation region 220. As described above with reference to FIGS. 2 to 4, the overlay keys may be used to determine a correction parameter for compensating for an overlay error.

In an example embodiment, a sample process of forming only overlay keys in key regions 230 may be executed to determine a correction parameter. For example, the sample process may be executed prior to a process for forming devices in the plurality of chip regions 210, and may be executed when a previously created correction parameter is not present or when a new correction parameter needs to be determined after a long time has elapsed since the previous correction parameter was created.

The sample process may include sample photolithography processes. However, overlay keys may have relatively large critical dimensions and spacing between structures (e.g., as compared to elements formed in the plurality of chip regions 210), and accordingly, the process may not need to be performed under the same conditions as a photolithography process for actually forming elements in the plurality of chip regions 210. In an example embodiment, by performing at least a portion of the sample photolithography processes using EUV light having relatively low intensity (as compared to the photolithography process for forming actual semiconductor elements), time and costs required to create a correction parameter to reduce the overlay error may be reduced. In example embodiments, the photoresist layer applied to the wafer 201 in the sample photolithography process may be a relatively inexpensive product (as compared to the photoresist used in the main photolithography process).

Figure 6:
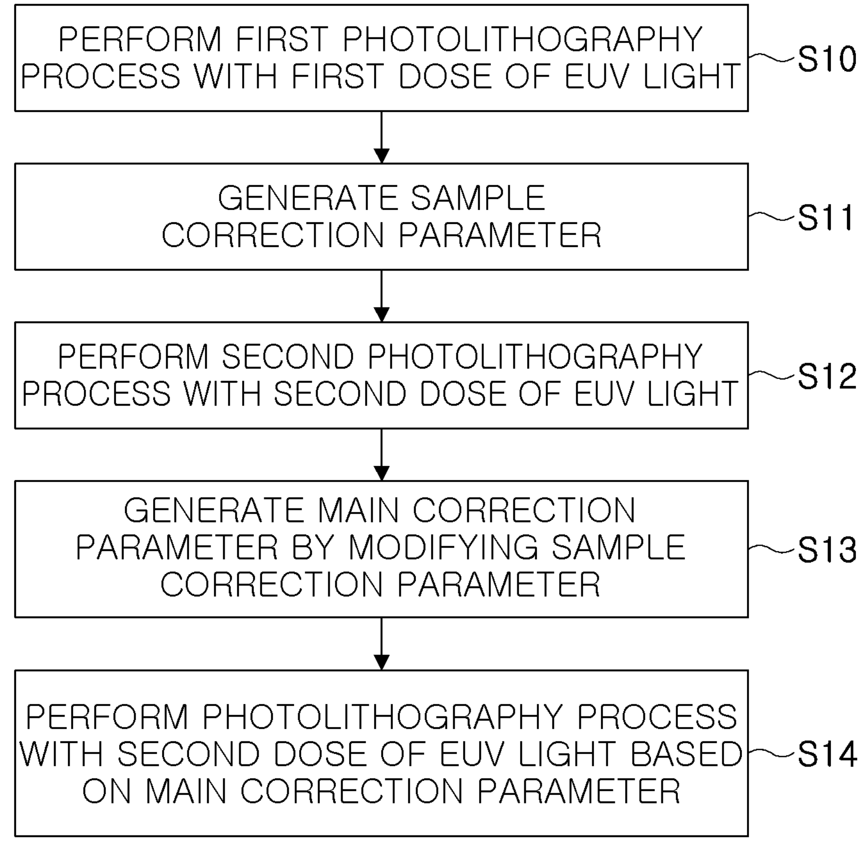
FIGS. 6 to 7 are flowcharts illustrating a method for controlling a semiconductor process according to an example embodiment of the present disclosure.
Figure 7:
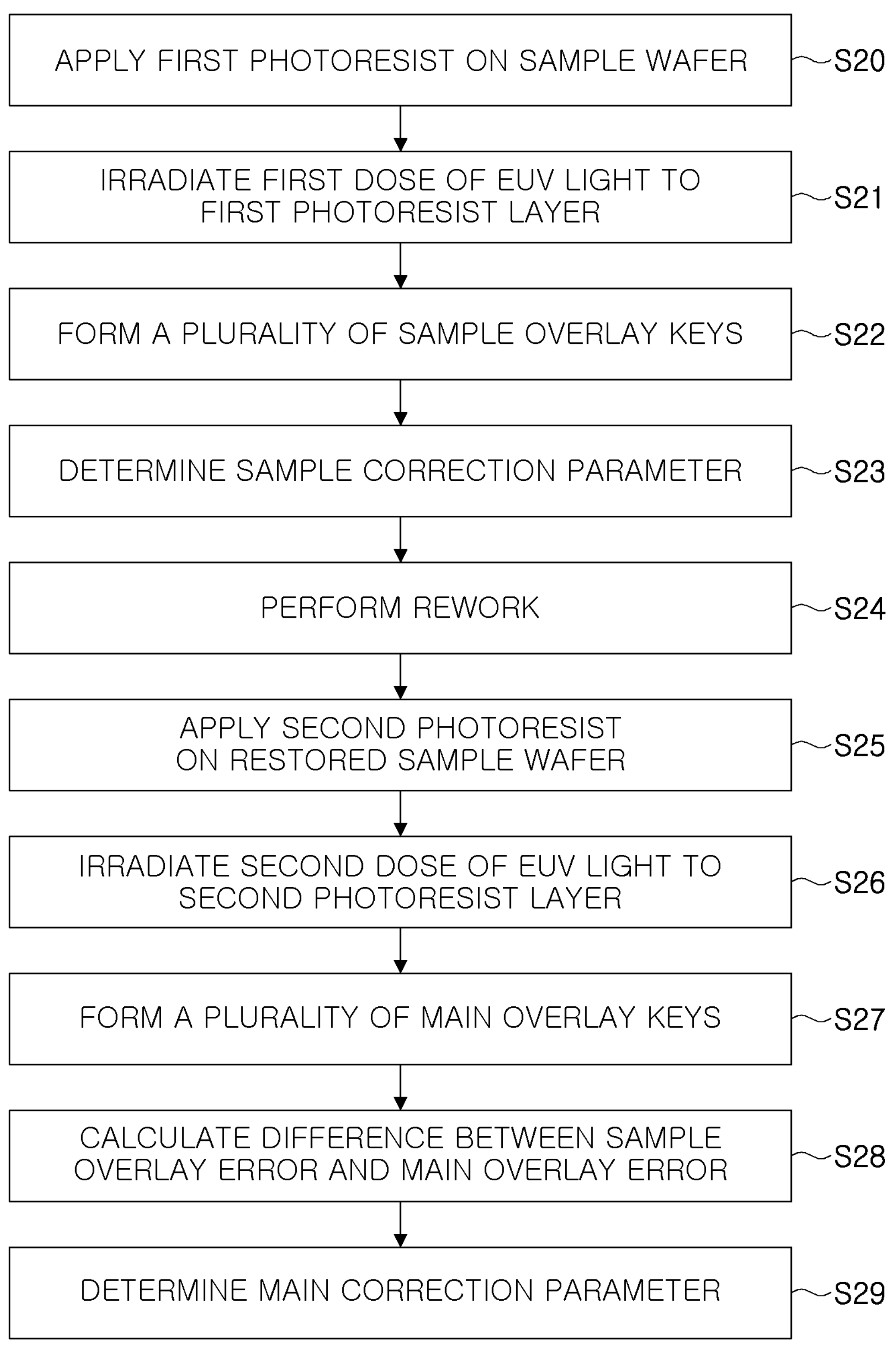

FIGS. 6 to 7 are flowcharts illustrating a method for controlling a semiconductor process according to an example embodiment.

Referring first to FIG. 6, the method of controlling a semiconductor process in an example embodiment may start by performing a first photolithography process with a first dose of extreme ultraviolet (EUV) light (S10). As an example, a semiconductor processing apparatus to which the method of controlling a semiconductor process described with reference to FIG. 6 is applied may be configured to perform a photolithography process using EUV light.

Prior to performing the first photolithography process with a first dose of EUV light in operation S10, a wafer may be seated on a wafer stage of a semiconductor processing apparatus, and a mask may be seated on a mask stage. Also, a first photoresist layer may be formed on the wafer. A first dose of EUV light may be emitted from a light source able to emit light in an extreme ultraviolet wavelength band, and may be reflected from a mask to be incident on a first photoresist layer.

By performing the first photolithography process of operation S10, sample overlay keys may be formed on the wafer. The sample overlay keys may include a plurality of structures formed on two or more layers stacked on a wafer. For example, by performing the first photolithography process using the first dose of EUV light at least twice as in operation S10, sample overlay keys may be formed on two or more stacked layers. The sample overlay keys may be formed in an isolation region defined between a plurality of chip regions on a wafer by the first photolithography process, and elements for implementing actual integrated circuits may not be formed in the plurality of chip regions. For example, referring to FIG. 5, sample overlay keys in the key regions 230 may be formed in the first photolithography process, while the chip regions 210 may remain untouched by the first dose of EUV light.

The control unit of the semiconductor processing apparatus may generate a sample correction parameter by referring to the sample overlay keys formed using the first dose of EUV light (S11). The sample correction parameter may be determined according to a sample overlay error measured in the sample overlay keys formed by the first photolithography process.

When a sample correction parameter is generated, a second photolithography process may be performed with a second dose of EUV light (S12). For example, the second dose may be higher than the first dose, and the second photolithography process of operation S12 may be performed using EUV light having a relatively higher degree of intensity than the first photolithography process of operation S10. For example, the second photolithography process of operation S12 may be performed under the same conditions as a photolithography process for forming semiconductor elements included in an integrated circuit. Also, in the second photolithography process, images for forming semiconductor elements in the chip regions of the wafer may be generated.

The second photolithography process of operation S12, which is performed using EUV light of higher degree of intensity, may require a longer time than the first photolithography process in operation S10. However, since higher intensity of EUV light is used, an image formed on a second photoresist layer in the second photolithography process may have a higher quality than an image formed on the first photoresist layer in the first photolithography process.

Accordingly, an overlay error measured in a main overlay keys formed by the second photolithography process may be different from the overlay error measured in the sample overlay keys formed by the first photolithography process. The control unit of the semiconductor processing apparatus may generate a main correction parameter by modifying the sample correction parameter by referring to the overlay error measured in the main overlay keys formed by the second photolithography process (S13). In an example embodiment, the control unit may correct the sample correction parameter based on the difference between the overlay error measured in the main overlay keys and the overlay error measured in the sample overlay keys, and may generate the main correction parameter.

When the main correction parameter is generated, the control unit of the semiconductor processing apparatus (e.g., the control unit 160 of the semiconductor processing apparatus 100) may perform a photolithography process with the second dose of EUV light based on the main correction parameter (S14). The photolithography process of operation S14, which is performed using the main correction parameter, may be another wafer put into the process following the sample wafer to which the operations of operations S10 to S13 are applied.

Meanwhile, the photolithography process of operation S14 may be a portion of a semiconductor process for forming elements in a plurality of chip regions included in a wafer using the second dose of EUV light. In other words, by performing operations S10 to S13 on the sample wafer to generate the main correction parameter, which may reduce the overlay error, and performing a photolithography process for forming elements in the plurality of chip regions of different wafers based on the main correction parameter, overlay error may be reduced.

Referring to FIGS. 1 and 7, the method of controlling a semiconductor process in an example embodiment may start by applying a first photoresist on a sample wafer (S20). The first photoresist may include a photosensitive material on which an image is formed in response to EUV light, and a first photoresist layer may be formed by coating the first photoresist on a sample wafer (e.g., a sample wafer on the wafer stage 150).

The light source 110 included in the semiconductor processing apparatus 100 may irradiate a first dose of EUV light toward the first photoresist layer formed in operation S20 (S21). EUV light may be reflected from the mask 145 and may be irradiated toward the first photoresist layer, and accordingly, an image corresponding to a pattern formed on the mask 145 may be created on the first photoresist layer.

When an image including a pattern is created in the first photoresist layer, a plurality of sample overlay keys may be formed by on the sample wafer (S22). For example, a plurality of sample overlay keys may be formed by the first photolithography process in operations S20 and S21, and an etching process and/or a deposition process subsequent to the first photolithography process. The plurality of sample overlay keys may include a plurality of structures formed on a plurality of sample layers stacked in a direction perpendicular to the upper surface of the sample wafer.

The control unit 160 of the semiconductor processing apparatus 100 may measure sample overlay errors in the plurality of sample overlay keys, and may determine a sample correction parameter based on the measurement (S23). The sample correction parameter may include data necessary to control, e.g., adjust position of, the wafer stage 150, the mask stage 144, and an optical system (e.g., the first and second sub-optical systems 120 and 130) in the semiconductor processing apparatus 100 such that a sample overlay error occurring during the process of forming a plurality of sample overlay keys may be reduced.

When the sample correction parameter is determined, rework may be performed (S24). The rework may include a process of removing the plurality of sample overlay keys, and may include, e.g., an etching process, polishing process, and cleaning process for removing sample layers in which the plurality of sample overlay keys are formed. By the rework, the sample wafer may be restored to a state before the first photoresist is applied, e.g., the reworked sample wafer may be thinner than the sample wafer in operation S20.

The semiconductor processing apparatus 100 may form a second photoresist layer by applying a second photoresist on the restored sample wafer (S25). For example, the second photoresist layer may have the same quality as that of the first photoresist layer, or may have a higher quality than that of the first photoresist layer in example embodiments. For example, as compared to the first photoresist layer, the second photoresist layer may have further improved critical dimension uniformity (CDU) and/or line edge roughness (LER).

When the second photoresist layer is formed, the semiconductor processing apparatus 100 may irradiate a second dose of EUV light to the second photoresist layer (S26). The second dose of EUV light may be reflected from the mask 145 and may be irradiated to the second photoresist layer, and the mask 145 reflecting the second dose of EUV light may be the same as the mask reflecting the first dose of EUV light in operation S21. Meanwhile, the second dose is greater than the first dose (e.g., in terms of intensity and application time), and EUV light having a higher degree of intensity than in operation S21 may be irradiated toward the second photoresist layer. When an image is formed on the second photoresist layer by irradiating the second dose of EUV light, a plurality of main overlay keys may be formed by performing a subsequent process (S27).

For example, a plurality of main overlay keys may be formed by a second photolithography process including operations S25 and S26 and an etching process and/or a deposition process performed thereafter. The plurality of main overlay keys may include a plurality of structures formed on a plurality of layers stacked in a direction perpendicular to the upper surface of the sample wafer.

The control unit 160 of the semiconductor processing apparatus 100 may measure the main overlay error in the plurality of main overlay keys, and may calculate the difference between the sample overlay error (i.e., the sample correction parameter determined in operation S23) and the main overlay error (S28).

As described above, since EUV light is irradiated on the same mask (i.e., mask 145) to form both the sample overlay keys and the main overlay keys, the sample overlay keys and the main overlay keys may include similar structures. However, due to the difference in quality between the first photoresist layer and the second photoresist layer applied to the sample wafer in operations S20 and S25, and/or the difference in intensity of EUV light irradiated in each of operations S21 and S26, the sample overlay error and the main overlay error may appear differently.

The control unit 160 of the semiconductor processing apparatus 100 may determine a main correction parameter based on the difference (S29), i.e., in view of the difference between the sample overlay error and the main overlay in operation S28. In an example embodiment, the control unit 160 of the semiconductor processing apparatus 100 may determine the main correction parameter by updating the sample correction parameter based on the difference between the sample overlay error and the main overlay error.

As described with reference to FIGS. 6 and 7, in an example embodiment, a main correction parameter may be determined according to a difference between the first dose and the second dose. Accordingly, when the second dose, which is the intensity of EUV light to be applied to the photolithography process for forming semiconductor elements in chip regions of the wafer, is changed, the operation of determining the main correction parameter may be performed again, e.g., the main correction parameter is regenerated.

In an example embodiment, the sample wafer may include a plurality of sample wafers included in a lot, and the method according to the example embodiment described with reference to FIG. 6 or FIG. 7 may be applied to the plurality of sample wafers to determine the main correction parameter. The control unit 160 of the semiconductor processing apparatus 100 may control the photolithography process for the sample wafer and other wafers by referring to the main correction parameter. Accordingly, the overlay errors appearing in the photolithography process may be reduced. The photolithography process may be performed under the same conditions as the previously described second photolithography process.

For example, a portion of a plurality of wafers included in one lot may be selected as sample wafers. A main correction parameter may be determined by selecting a portion of a plurality of wafers included in a lot as sample wafers and applying the control method described with reference to FIG. 6 or FIG. 7 to the sample wafers. Thereafter, a main correction parameter may be applied to the remaining wafers included in the same lot as the sample wafer, a photolithography process for forming semiconductor elements may be performed instantly.

In another example, the entirety of wafers included in a lot may be selected as sample wafers, the control method described with reference to FIG. 6 or 7 may be applied, and a main correction parameter may be determined. In this case, a photolithography process may be performed for wafers of a lot put into to the process following a lot including only sample wafers based on the main correction parameter.

Figure 8:
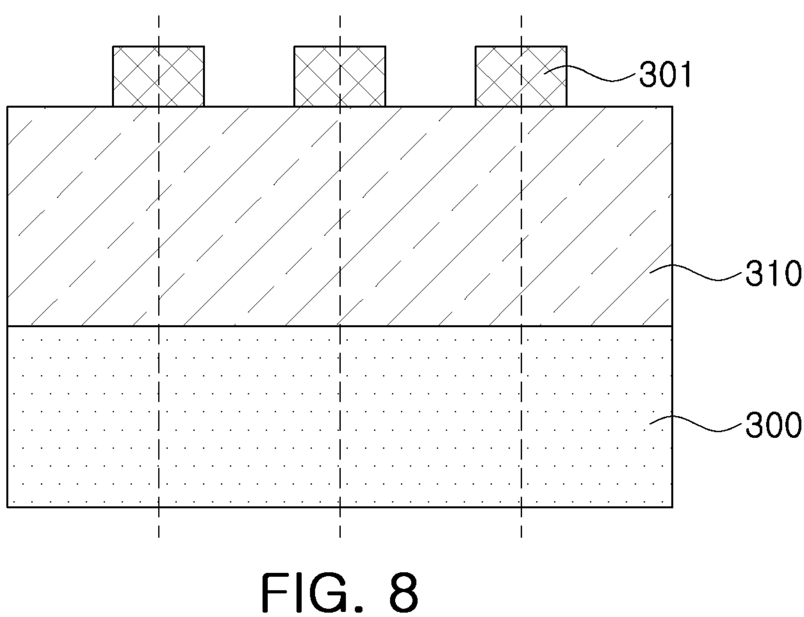
FIGS. 8 to 10 are diagrams illustrating a sample photolithography process controlled by a method of controlling semiconductor process according to an example embodiment of the present disclosure.
Figure 9:
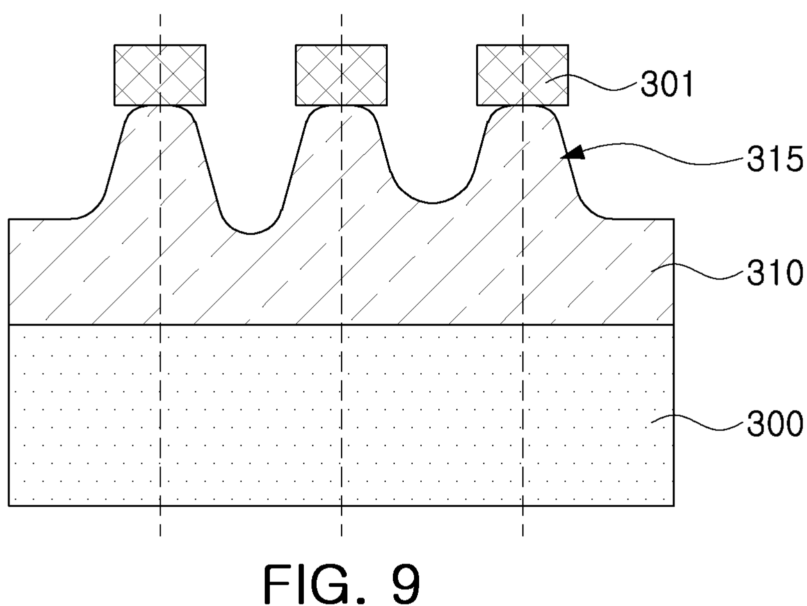
Figures 10, 11:
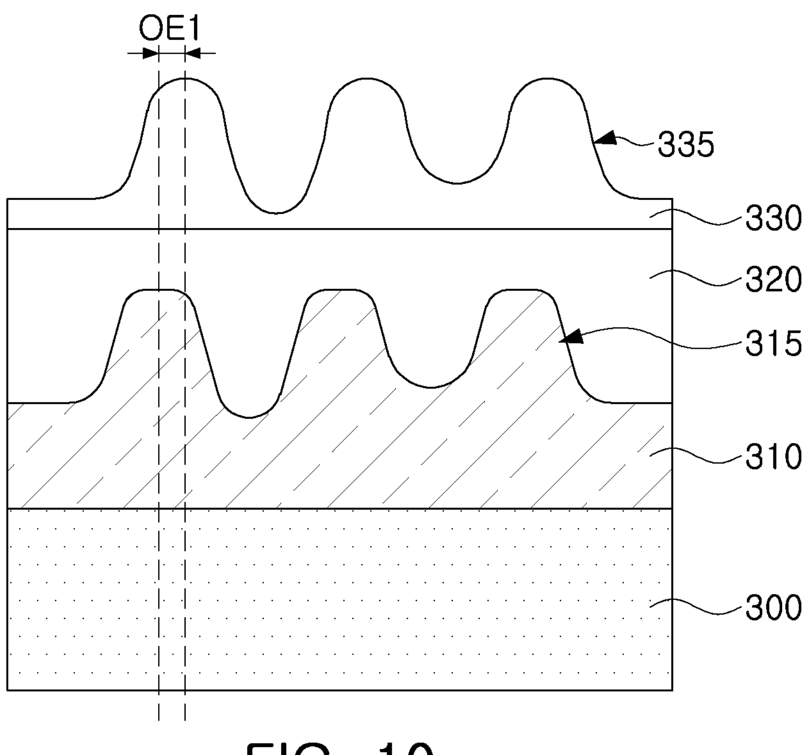
FIGS. 11 to 14 are diagrams illustrating a sample photolithography process controlled by a method of controlling semiconductor process according to an example embodiment of the present disclosure.

FIGS. 8 to 10 are diagrams illustrating stages in a sample photolithography process controlled by a method of controlling semiconductor process according to an example embodiment. A first photolithography process (i.e., operation S10 in FIG. 6), which is a portion of a process for forming sample overlay keys in an isolation region defined between a plurality of chip regions in a sample wafer, will be described with reference to FIGS. 8 to 10.

Referring to FIG. 8, the semiconductor processing apparatus may form a first sample layer 310 on a sample wafer 300, and may form a first photoresist layer 301 thereon. For example, a first dose of EUV light output by a light source and reflected from a mask may be irradiated to the first photoresist layer 301, and accordingly, the first photoresist layer 301 may have a predetermined pattern, as illustrated in FIG. 8.

Referring to FIG. 9, an etching process may be performed on the first sample layer 310 in a region from which the first photoresist layer 301 is removed (i.e., between portions of the first photoresist layer 301 that are spaced apart from each other). For example, the etching process may be performed in an etching device different from the semiconductor processing apparatus 100 irradiating a first dose of EUV light to the first photoresist layer 301.

When the etching process is completed, first sample structures 315 may be formed on the first sample layer 310, as illustrated in FIG. 9. The first photoresist layer 301 may be irradiated with the first dose of EUV light, which may be relatively weak and irradiated for a shorter time, and a pattern formed on the first photoresist layer 301 may have a relatively low quality, e.g., have relatively poor uniformity (e.g., decreased critical dimension uniformity) and/or unclear contours (e.g., increased line edge roughness) (FIG. 9).

Referring to FIG. 10, a second sample layer 320 may be formed on the first sample layer 310, and a third sample layer 330 may be formed thereon. As illustrated in FIG. 10, second sample structures 335 may be formed on the third sample layer 330, and the second sample structures 335 may form sample overlay keys together with the first sample structures 315. However, an example embodiment thereof is not limited thereto, e.g., the shape and arrangement of structures included in the sample overlay keys may be varied in example embodiments.

As illustrated in FIG. 10, sample overlay error OE1 may be measured in the sample overlay keys. The sample overlay error OE1 may be measured as a coordinate difference between the centers of the first sample structures 315 and the centers of the second sample structures 335. As described above with reference to FIGS. 2 to 4, the sample overlay error OE1 may have directionality in various directions in a region in which the sample overlay keys are formed.

When the sample overlay error OE1 is measured, the control unit of the semiconductor processing apparatus may generate a sample correction parameter based on the sample overlay error OE1. For example, the sample correction parameter may include data for controlling a wafer stage, a mask stage, and an optical system of a semiconductor processing apparatus to reduce the sample overlay error OE1. A sample correction parameter may be generated to reduce the sample overlay error OE1 generated in a first photolithography process of irradiating the first dose of EUV light.

However, process conditions applied to the first photolithography process may be different from process conditions applied to a photolithography process for forming semiconductor elements in chip regions of a wafer. For example, differently from a photolithography process for forming semiconductor elements, EUV light may be irradiated to the first photoresist layer 301 with a relatively weak intensity in the first photolithography process. Also, in example embodiments, the first photoresist layer 301 may have a relatively low quality as compared to a photoresist layer applied on a wafer in a photolithography process for forming semiconductor elements. By limiting the intensity of EUV light and the quality of the first photoresist layer 301, as described above, costs and time required for the first photolithography process may be reduced and the sample correction parameters may be rapidly generated.

However, when the photolithography process for forming semiconductor elements is controlled with reference to only the sample correction parameter, as described above, overlay errors generated in the photolithography process may not be sufficiently corrected due to different process conditions. Accordingly, in an example embodiment, after determining the sample correction parameter, the plurality of sample layers 310, 320, and 330 may be removed, a second photolithography process may be performed under the same conditions as the photolithography process for forming semiconductor elements, and the correction parameter may be modified. For example, a plurality of layers including a plurality of main overlay keys may be formed on the sample wafer 300 by the second photolithography process. The control unit of the semiconductor processing apparatus may measure the main overlay error in a plurality of main overlay keys and may update the sample correction parameter based on the main overlay error and may generate the main correction parameter, which will be described in greater detail with reference to FIGS. 11 to 14.

FIGS. 11 to 14 are diagrams illustrating stages in a photolithography process controlled by a method of controlling semiconductor process according to an example embodiment.

The process described with reference to FIGS. 11 to 14 refers to a second photolithography process (i.e., operation S12 in FIG. 6) which may be a portion of a process for forming main overlay keys in an isolation region defined between a plurality of chip regions in a sample wafer. Differently from the first photolithography process described with reference to FIGS. 8 to 10, the second photolithography process may be performed under the same conditions as the main photolithography process for forming semiconductor elements in a plurality of chip regions. In example embodiments, semiconductor elements included in an integrated circuit may be formed in a plurality of chip regions of a sample wafer by the second photolithography process and subsequent processes thereafter. Also, the second photolithography process may be performed on the sample wafer 300 restored to an initial state by rework after the first photolithography process.

Referring to FIG. 11, a semiconductor processing apparatus may form a first layer 340 on a sample wafer 300, and may form a second photoresist layer 303 thereon. For example, a second dose of EUV light output by a light source and reflected from a mask may be irradiated to the second photoresist layer 303, and accordingly, the second photoresist layer 303 may have a predetermined pattern, as illustrated in FIG. 11.

The second dose of EUV light may be greater than the first dose of EUV light. Also, in example embodiments, the second photoresist layer 303 may have further improved quality than the first photoresist layer 301.

Figure 12:
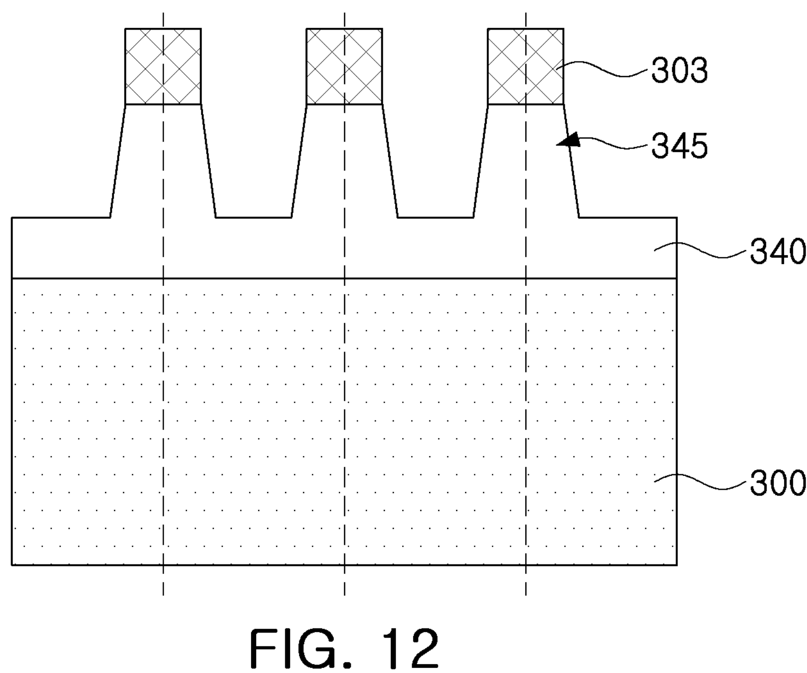

Referring to FIG. 12, an etching process may be performed on the first layer 340. When the etching process is completed, first structures 345 may be formed on the first layer 340, as illustrated in FIG. 12. Since the second photoresist layer 303 having relatively good quality is irradiated with the second dose of EUV light higher than the first dose, the pattern formed on the second photoresist layer 303 may have a relatively higher quality than that of the pattern formed on the first photoresist layer 301 (i.e., than the first sample structures 315). Accordingly, as illustrated in FIG. 12, the first structures 345 may have further improved uniformity as compared to the first sample structures 315.

Figure 13:
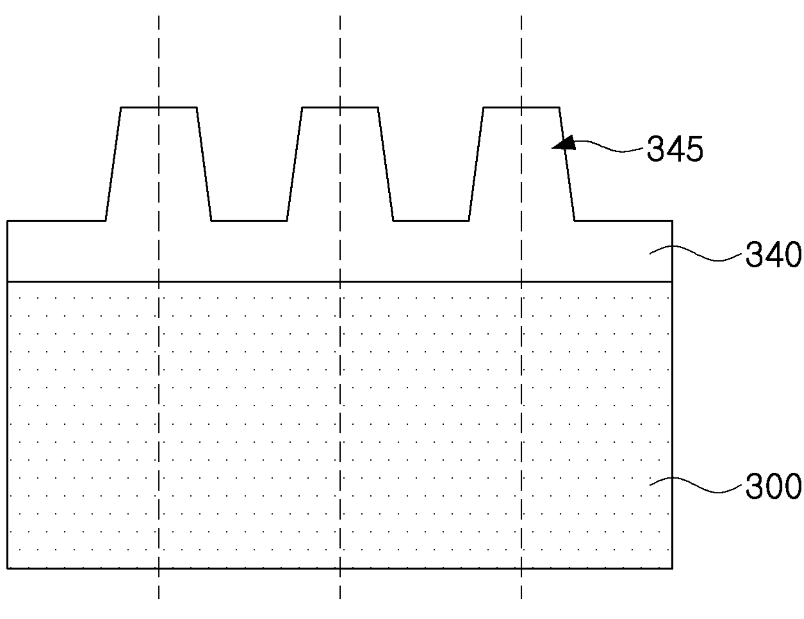
Figure 14:
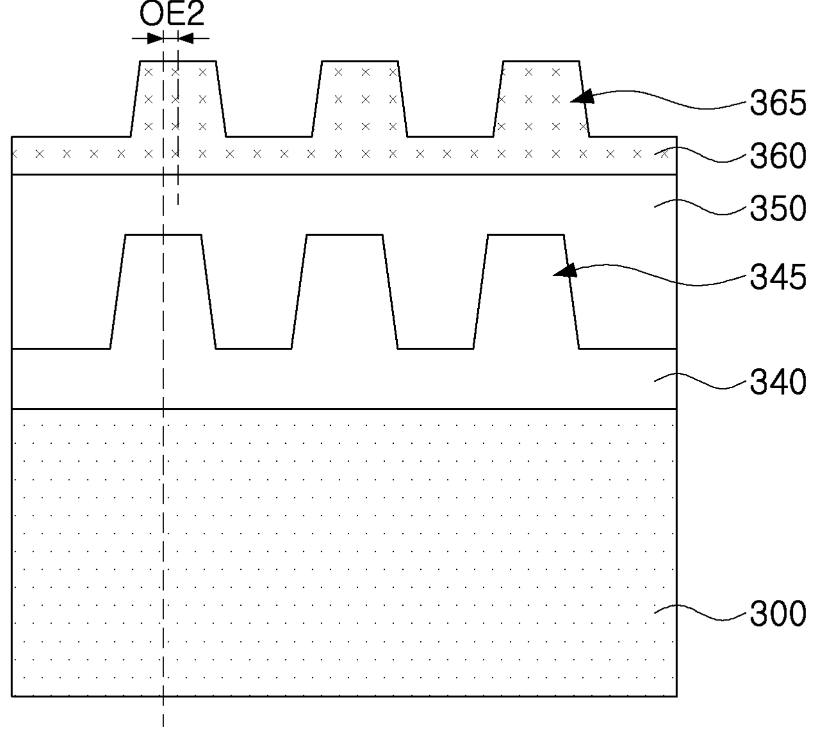

Referring to FIGS. 13 and 14, the second photoresist layer 303 may be removed, and a second layer 350 and a third layer 360 may be formed. As illustrated in FIG. 14, second structures 365 may be formed on the third layer 360, and the second structures 365 may form main overlay keys together with the first structures 345. However, the shape and arrangement of structures included in the main overlay keys may be varied in example embodiments.

As illustrated in FIG. 14, the main overlay error OE2 may be measured in the main overlay keys, and the main overlay error OE2 may be different from the sample overlay error OE1. The control unit 160 of the semiconductor processing apparatus 100 may update the sample correction parameter to the main correction parameter based on the difference between the sample overlay error OE1 and the main overlay error OE2. The main correction parameter may include data for controlling a wafer stage, a mask stage, and an optical system, of the semiconductor processing apparatus such that the main overlay error OE2 appearing in the second photolithography process, which is performed under the same conditions as the general photolithography process for forming semiconductor elements, may be reduced.

When the main correction parameter is determined, the control unit 160 may control the photolithography process performing to form semiconductor elements in other wafers put into the process after the sample wafer 300 by referring to the main correction parameter. Accordingly, overlay errors which may occur in a photolithography process for forming semiconductor elements included in an integrated circuit may be reduced.

Figure 15A:
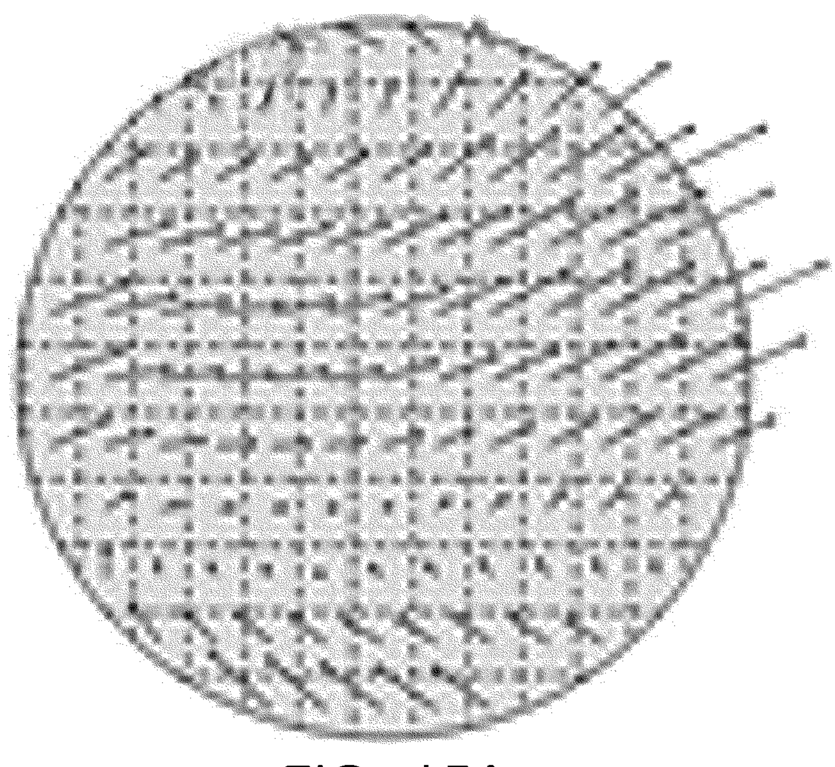
FIGS. 15A and 15B are diagrams illustrating an overlay error measured in a method of controlling a semiconductor process according to an example embodiment of the present disclosure.
Figure 15B:
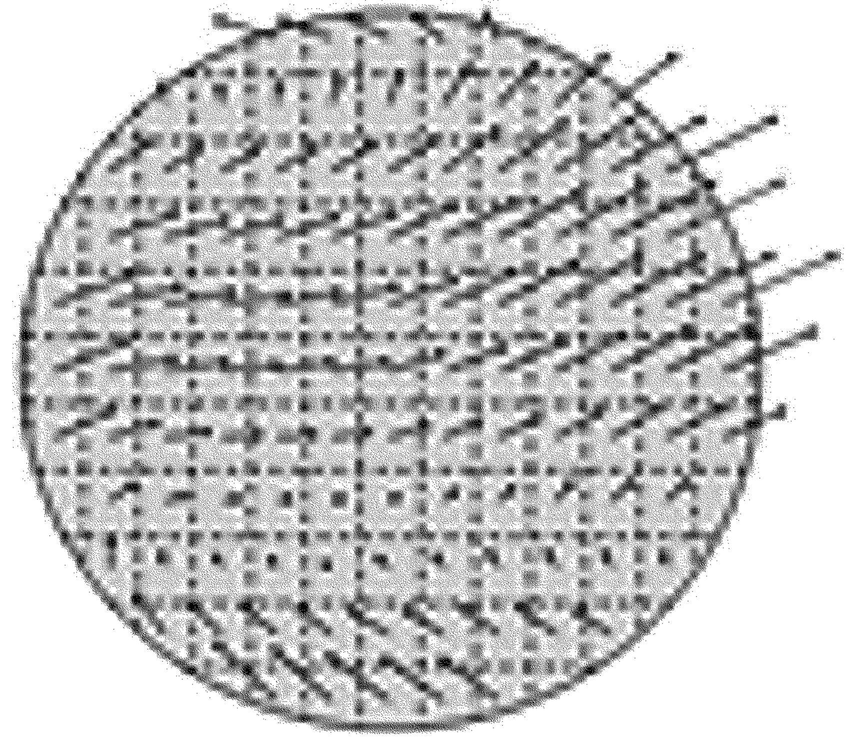

FIGS. 15A and 15B are diagrams illustrating an overlay error measured in a method of controlling a semiconductor process according to an example embodiment.

FIG. 15A is a diagram illustrating a sample overlay error observed in a sample overlay key formed by a first photolithography process. Meanwhile, FIG. 15B is a diagram illustrating a main overlay error observed in a main overlay key formed by a second photolithography process. In the first photolithography process, the intensity of EUV light is determined to be at a first dose, and in the second photolithography process, the intensity of EUV light is determined to be at a second dose higher than the first dose. Accordingly, in at least a portion of regions of the sample wafer, the sample overlay error and the main overlay error may appear differently from each other.

In an example embodiment, the control unit 160 of the semiconductor processing apparatus 100 may measure a sample overlay error and may generate a sample correction parameter, and may generate a main correction parameter. For example, after generating the sample correction parameter, the control unit 160 may generate the main correction parameter based on the difference between the sample overlay error and the main overlay error.

For example, the control unit 160 of the semiconductor processing apparatus 100 may reflect an overlay delta value (i.e., the difference between the overlay sample error and the main overlay error) to the sample correction parameter in advance, based on the difference between the first dose and the second dose, before measuring the main overlay error. For example, the overlay delta value may be determined in advance by performing a photolithography process multiple times while changing the dose of EUV light for a separate test wafer different from the sample wafer. The control unit 160 may update a sample correction parameter based on the overlay delta value, and may perform a second photolithography process based on the updated sample correction parameter.

The control unit 160 may measure the main overlay error generated in the second photolithography process and may calculate an overlay error difference between the sample overlay error and the main overlay error. Also, the control unit 160 may update the overlay delta value using the difference between the sample overlay error and the main overlay, and may generate a main correction parameter by reflecting the updated overlay delta value to the sample correction parameter. The control unit 160 may perform the photolithography process on the main wafers of a subsequent lot put into the process subsequently to the lot including the sample wafers based on the main correction parameter.

When a photolithography process is performed with a first dose of EUV light, a temperature may increase in an optical system, a mask, and a wafer. Similarly, when the photolithography process is performed with the second dose of EUV light, the temperature of the optical system, a mask, and a wafer may increase. However, due to the difference in intensity of EUV light, a first temperature change when the photolithography process is performed with the first dose of EUV light may be different from a second temperature change when the photolithography process is performed with the second dose of EUV light. Due to the difference between the first temperature change and the second temperature change, a sample overlay error and a main overlay error may appear differently.

The difference between the first temperature change and the second temperature change may be due to the difference between the first dose and the second dose, and the difference between the sample overlay error and the main overlay error due to the difference between the first temperature change and the second temperature change may be a system dependent variable. Accordingly, the control unit 160 of the semiconductor processing apparatus 100 may perform the photolithography process on a test wafer, e.g., a non-product wafer (NPW), while changing the dose of EUV light, and may obtain an overlay delta value, which is a difference in overlay error according to the dose of EUV light, in advance.

The control unit 160*b* may update the sample correction parameter obtained after the first photolithography process using an overlay delta value according to a difference in dose of EUV light. Also, by updating the overlay delta value with the measured overlay difference, after performing the second photolithography process based on the updated sample correction parameter, an overlay error may be accurately corrected for main wafers of a subsequent lot other than the sample wafers.

Figure 16A:
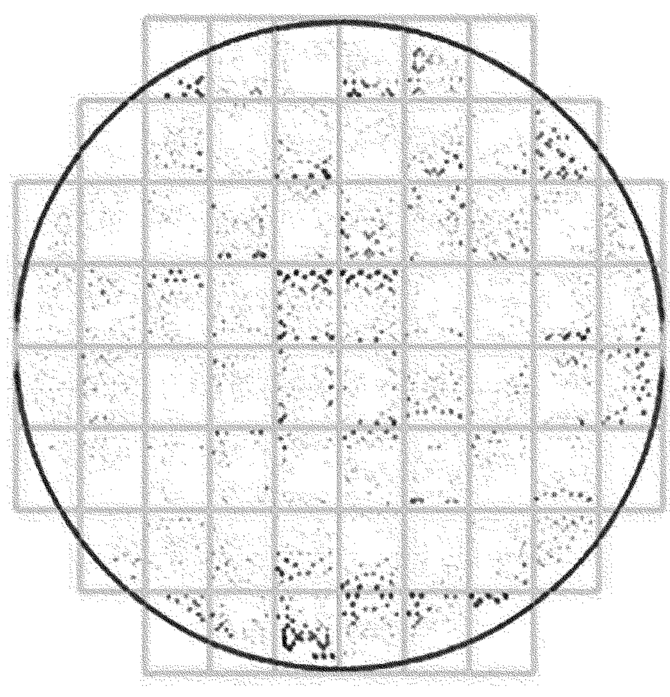
FIGS. 16A to 16C are diagrams illustrating a difference in overlay errors measured in a method of controlling a semiconductor process according to an example embodiment of the present disclosure.
Figure 16B:
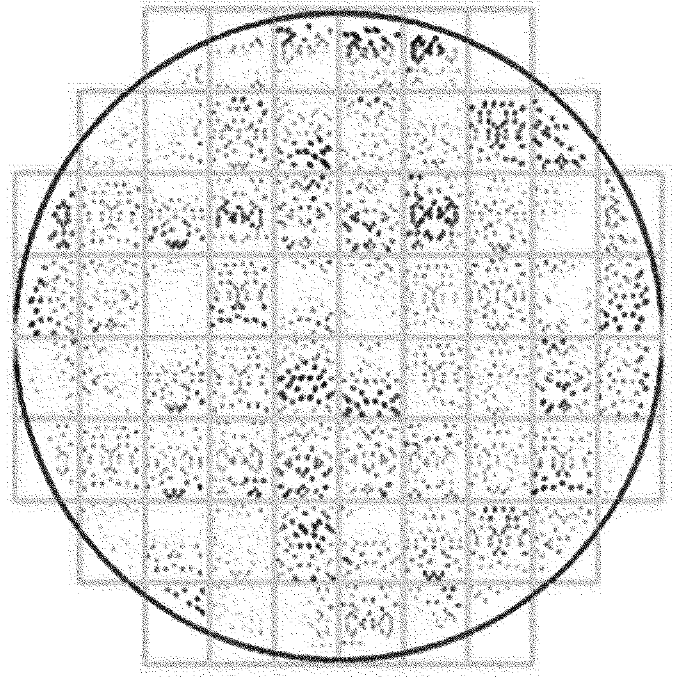
Figure 16C:
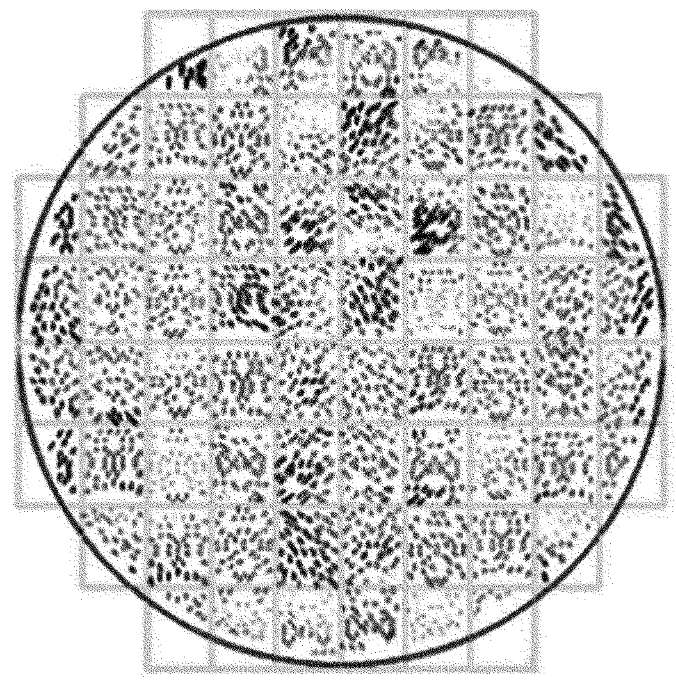

FIGS. 16A to 16C are diagrams illustrating a difference in overlay errors measured in a method of controlling a semiconductor process according to an example embodiment. FIGS. 16A to 16C illustrate overlay delta values of a difference between a sample overlay error measured in a first photolithography process and a main overlay error in a second photolithography process. In the example embodiments illustrated in FIGS. 16A to 16C, the difference between the first dose of EUV light emitted by the light source in the first photolithography process and the second dose of EUV light emitted by the light source in the second photolithography process is different.

For example, in the example embodiment illustrated in FIG. 16A, the difference between the first dose and the second dose may be the first difference, and in the example embodiment illustrated in FIG. 16B, the difference between the first dose and the second dose may be a second difference greater than the first difference. In the example embodiment illustrated in FIG. 16C, the difference between the first dose and the second dose may be determined to be a third difference greater than the second difference. For example, in FIGS. 16A to 16C, the first dose may be 30 mJ in common. As illustrated in FIGS. 16A to 16C, the overlay delta value may increase as the difference between the first dose and the second dose increases.

The control unit 160 of the semiconductor processing apparatus 100 may obtain overlay delta values in advance according to a dose difference of EUV light irradiated on the test wafer using a test wafer, e.g., a non-product wafer, and may store the values in a memory. The overlay delta values stored in the memory may be applied to correct the sample correction parameter obtained by the control unit from the first photolithography process according to the difference in the dose of EUV light applied to each of the first photolithography process and the second photolithography process, performed in order on the sample wafer.

Figure 17:
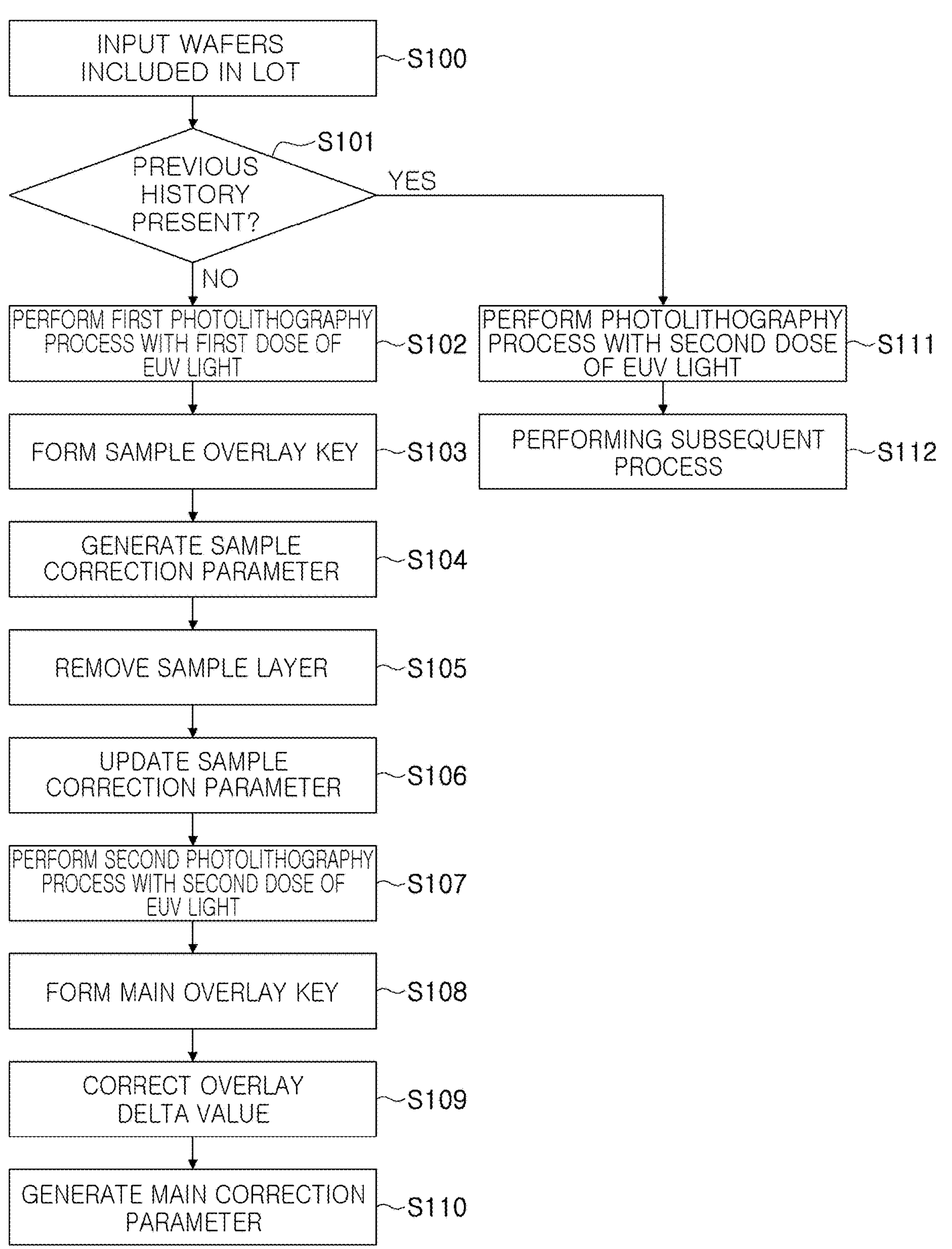
FIG. 17 is a flowchart illustrating a method of controlling a semiconductor process according to an example embodiment of the present disclosure.

FIG. 17 is a flowchart illustrating a method of controlling a semiconductor process according to an example embodiment.

Referring to FIG. 17, the method of controlling a semiconductor process in an example embodiment may start with putting wafers included in a lot into the process (S100). A lot may be a unit for grouping wafers, and the number of wafers included in one lot may vary in example embodiments.

When the semiconductor processing apparatus 100 receives wafers grouped into a lot, the control unit 160 of the semiconductor processing apparatus may determine whether a previous history is present (S101). The semiconductor processing apparatus receiving wafers may be configured to perform a photolithography process using EUV light. The control unit 160*b* may determine whether there is a previous history of performing the photolithography process by irradiating EUV light to the mask 145 disposed on the mask stage 144 in process S101.

In the case in which the result of the determination in operation S101 is that the previous history is not present, the control unit 160 may perform a task for generating a correction parameter necessary for reducing the overlay error. The control unit may first perform a first photolithography process with a first dose of EUV light (S102). The semiconductor processing apparatus may form a sample overlay key (S103) by performing the first photolithography process, and may generate a sample correction parameter for correcting a sample overlay error measured in the sample overlay key (S104).

When the sample correction parameter is determined, the sample layer on which the sample overlay key is formed may be removed by a rework process (S105). The sample layer formed on the sample wafer may be removed by the rework process, and the sample wafer may be restored to an original bare wafer state.

The control unit of the semiconductor processing apparatus may update the sample correction parameter based on the difference between the first dose and the second dose (S106). Operation S106 may not necessarily need to be performed after the rework process of operation S105, e.g., operation S106 may be started before the rework process or may be performed together with the rework process.

The second dose of EUV light may be an output of a light source in a second photolithography process to be performed on a sample wafer restored to an original state after the rework process is completed. Since the second dose has a predetermined value, the control unit may update the sample correction parameter by referring to the overlay delta value determined according to the difference between the first dose and the second dose. As described above with reference to FIGS. 16A to 16C, an overlay delta value according to a difference in intensity of EUV light may be generated in advance in a photolithography process performed on a test wafer and may be stored in a memory. For example, as the difference between the first dose and the second dose increases, the overlay delta value may increase.

The semiconductor processing apparatus may perform a second photolithography process with reference to the sample correction parameter updated by the overlay delta value (S107). The second photolithography process may be performed with a second dose of EUV light, and a main overlay key (S108) may be formed by the second photolithography process. The control unit may measure the main overlay error on the main overlay key.

The control unit may calculate the difference between the sample overlay error and the main overlay error, and may correct the overlay delta value applied to update the sample correction parameter in operation S106 using the difference in the overlay errors (S109). Also, by applying the overlay delta value corrected in operation S109 to the sample correction parameter obtained in operation S104, a main correction parameter to be applied to the photolithography process of wafers grouped into a subsequent lot may be generated (S110).

When the main correction parameter is generated, the semiconductor processing apparatus may correct the overlay error with the main correction parameter and may perform the photolithography process without performing a sample photolithography process on the wafers of a subsequent lot. For example, when wafers included in a new lot (i.e., operation S100) are determined to have a previous history present (i.e., operation S101), a photolithography process may be immediately performed with a second dose of EUV light (S111), i.e., without performing operations S102 to S110. The photolithography process in operation S111 may include a process of imaging a predetermined pattern by irradiating the second dose of EUV light to the photoresist layer formed on the wafer. Thereafter, by performing subsequent processes, e.g., a deposition process, an etching process, and a cleaning process (S112), semiconductor elements for implementing an integrated circuit may be formed in the chip regions of the wafer.

By way of summation and review, when a photolithography process for forming a pattern on a photoresist layer using EUV light is performed without previous history, a sample photolithography process for determining a correction parameter for correcting an overlay error may be performed. However, when the sample photolithography process is performed under the same conditions as the main photolithography process for forming actual patterns, costs and time may increase.

In contrast, example embodiments provide a method of controlling a semiconductor process and a semiconductor processing apparatus which may reduce the time and costs required for the sample exposure process using relatively weak intensity EUV light and/or a low quality photoresist layer in a sample photolithography process for determining correction parameters to reduce an overlay error. That is, when a sample photolithography process is performed in a state in which the correction parameter for reducing the overlay error has not been determined (i.e., in a state in which there is no previous history), a relatively low dose of EUV light may be used or a relatively low quality photoresist layer may be used. Accordingly, by swiftly completing the sample photolithography process at a low cost, the entire process of manufacturing a semiconductor may be efficiently controlled.

The methods, processes, and/or operations described herein may be performed by code or instructions to be executed by a computer, processor, controller, or other signal processing device. The computer, processor, controller, or other signal processing device may be those described herein or one in addition to the elements described herein. The algorithms, code or instructions for implementing the operations of the method embodiments herein may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, or controller which is to execute the code or instructions for performing the method embodiments described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of controlling a semiconductor process, the method comprising:

forming a first photoresist layer on at least one sample wafer;

forming a plurality of sample overlay keys on the at least one sample wafer by radiating a first dose of extreme ultraviolet (EUV) light toward the first photoresist layer;

measuring a sample overlay error from the plurality of sample overlay keys;

determining a sample correction parameter for correcting the sample overlay error;

updating the sample correction parameter into an updated sample correction parameter, based on a difference between the first dose of EUV light and a second dose of EUV light;

forming a second photoresist layer on the at least one sample wafer;

forming a plurality of main overlay keys on the at least one sample wafer by radiating the second dose of EUV light toward the second photoresist layer, based on the updated sample correction parameter;

measuring a main overlay error from the plurality of main overlay keys;

determining a main correction parameter based on the main overlay error; and performing a photolithography process on an additional wafer different from the at least one sample wafer, based on the main correction parameter.

2. The method as claimed in claim 1, further comprising removing a sample layer including the plurality of sample overlay keys, before forming the second photoresist layer.

3. The method as claimed in claim 1, wherein performing the photolithography process includes irradiating the second dose of EUV light toward a third photoresist layer on the additional wafer.

4. The method as claimed in claim 3, further comprising regenerating the main correction parameter in response to a change in the second dose of EUV light during the photolithography process.

5. The method as claimed in claim 1, wherein the sample correction parameter is updated based on an overlay delta value determined based on a difference between the first dose of EUV light and the second dose of EUV light.

6. The method as claimed in claim 5, wherein:

the overlay delta value is updated into an updated overlay delta value, based on a difference between the sample overlay error and the main overlay error, and the main correction parameter is determined by applying the updated overlay delta value to the sample correction parameter.

7. The method as claimed in claim 5, wherein the overlay delta value increases as the difference between the first dose of EUV light and the second dose of EUV light increases.

8. The method as claimed in claim 1, wherein the at least one sample wafer includes a plurality of sample wafers in a first lot of wafers.

9. The method as claimed in claim 8, wherein the additional wafer is included in a second lot of wafers different from the first lot.

10. The method as claimed in claim 8, wherein the additional wafer is included in the first lot.

11. A method of controlling a semiconductor process, the method comprising:

forming a plurality of sample layers including a plurality of sample overlay keys on at least one sample wafer while a light source outputs a first dose of extreme ultraviolet (EUV) light;

measuring a sample overlay error from the plurality of sample overlay keys;

generating a sample correction parameter based on the sample overlay error;

forming a plurality of layers including a plurality of main overlay keys on the at least one sample wafer while the light source outputs a second dose of EUV light different from the first dose of EUV light;

measuring a main overlay error from the plurality of main overlay keys;

generating a main correction parameter using the sample correction parameter and a difference between the main overlay error and the sample overlay error; and controlling a photolithography process performed on an additional wafer different from the at least one sample wafer using the main correction parameter.

12. The method as claimed in claim 11, wherein:

the first dose of EUV light and the second dose of EUV light are reflected from a sample mask and are radiated toward the at least one sample wafer, and a temperature of the at least one sample wafer during radiation of the first dose of EUV light is lower than during radiation of the second dose of EUV light.

13. The method as claimed in claim 11, wherein a difference between the main overlay error and the sample overlay error increases as a difference between the first dose of EUV light and the second dose of EUV light increases.

14. The method as claimed in claim 11, further comprising outputting by the light source the second dose of EUV light during the photolithography process.

15. The method as claimed in claim 11, wherein the sample correction parameter is updated using an overlay delta value determined according to a difference between the first dose of EUV light and the second dose of EUV light, and the plurality of layers are formed on the at least one sample wafer using the updated sample correction parameter.

16. The method as claimed in claim 15, further comprising determining the overlay delta value according to the difference between the first dose of EUV light and the second dose of EUV light by performing a test photolithography process for a test wafer different from the at least one sample wafer multiple times, while changing a dose of EUV light.

* * * * *